(12) United States Patent
Mazzola

(10) Patent No.: US 8,592,826 B2
(45) Date of Patent: Nov. 26, 2013

(54) SILICON CARBIDE AND RELATED WIDE-BANDGAP TRANSISTORS ON SEMI INSULATING EPITAXY

(76) Inventor: Michael S. Mazzola, Starkville, MS (US)

( * ) Notice: Subject to any disclaimer, the term of this patent is extended or adjusted under 35 U.S.C. 154(b) by 0 days.

(21) Appl. No.: 13/449,502

(22) Filed: Apr. 18, 2012

(65) Prior Publication Data

US 2012/0199940 A1    Aug. 9, 2012

Related U.S. Application Data

(60) Continuation of application No. 12/881,771, filed on Sep. 14, 2010, now Pat. No. 8,183,124, which is a division of application No. 11/764,593, filed on Jun. 18, 2007, now Pat. No. 7,821,015.

(60) Provisional application No. 60/805,139, filed on Jun. 19, 2006.

(51) Int. Cl.
*H01L 29/15*       (2006.01)
*H01L 31/0312*     (2006.01)

(52) U.S. Cl.
USPC ........... 257/77; 438/424; 257/E21.54; 257/78

(58) Field of Classification Search
USPC .................. 257/77, 78, E21.54; 434/424
See application file for complete search history.

(56) References Cited

U.S. PATENT DOCUMENTS

| | | | |
|---|---|---|---|
| 3,946,151 A | 3/1976 | Kamiyama | |
| 4,207,583 A | 6/1980 | Temple | |
| 4,465,750 A | 8/1984 | Ogawa et al. | |
| 4,825,061 A | 4/1989 | Schoenbach et al. | |
| 4,947,218 A | 8/1990 | Edmond et al. | |
| 5,135,885 A * | 8/1992 | Furukawa et al. | 438/167 |
| 5,864,166 A | 1/1999 | Stoudt et al. | |
| 6,046,466 A | 4/2000 | Ishida et al. | |
| 6,063,186 A | 5/2000 | Irvine et al. | |
| 6,191,458 B1 | 2/2001 | Brown et al. | |
| 6,303,475 B1 | 10/2001 | Suvorov et al. | |
| 6,437,538 B1 | 8/2002 | Tsurumi et al. | |

(Continued)

FOREIGN PATENT DOCUMENTS

| | | |
|---|---|---|
| JP | 56025743 A | 3/1981 |
| JP | 2006080560 A | 3/2006 |
| WO | 2004114422 A1 | 12/2004 |

OTHER PUBLICATIONS

Notification of Transmittal of the International Search Report and the Written Opinion of the International Search Authority, or the Declaration, International Patent Application No. PCT/US2007/71549, International Filing Date: Jun. 19, 2007, Mailing Date: Nov. 15, 2007.

(Continued)

*Primary Examiner* — Julio J Maldonado
*Assistant Examiner* — Sonya D McCall Shepard

(57) ABSTRACT

A method of making a semi-insulating epitaxial layer includes implanting a substrate or a first epitaxial layer formed on the substrate with boron ions to form a boron implanted region on a surface of the substrate or on a surface of the first epitaxial layer, and growing a second epitaxial layer on the boron implanted region of the substrate or on the boron implanted region of the first epitaxial layer to form a semi-insulating epitaxial layer.

17 Claims, 7 Drawing Sheets

(56) References Cited

U.S. PATENT DOCUMENTS

| | | | |
|---|---|---|---|
| 6,767,783 | B2 | 7/2004 | Casady et al. |
| 7,009,209 | B2 | 3/2006 | Casady et al. |
| 7,582,917 | B2 | 9/2009 | Sheu |
| 7,821,015 | B2 | 10/2010 | Mazzola |
| 2002/0096684 | A1 | 7/2002 | Brandes et al. |
| 2002/0149021 | A1 | 10/2002 | Casady et al. |
| 2005/0051861 | A1 | 3/2005 | Shi et al. |
| 2005/0233091 | A1 | 10/2005 | Kumar et al. |
| 2006/0062897 | A1 | 3/2006 | Gu et al. |
| 2006/0078675 | A1 | 4/2006 | Kumar et al. |
| 2006/0102908 | A1 | 5/2006 | Imai et al. |
| 2006/0208261 | A1* | 9/2006 | Kaneko et al. .......... 257/77 |
| 2006/0228497 | A1 | 10/2006 | Kumar et al. |
| 2006/0228897 | A1 | 10/2006 | Timans |
| 2007/0029573 | A1 | 2/2007 | Cheng et al. |
| 2008/0160685 | A1 | 7/2008 | Sankin et al. |

OTHER PUBLICATIONS

N. Nordell [Jul. 1998] Journal of Electronic Materials; Boron Implantation and Epitaxial Regrowth Studies of 6H SiC.
International Search Report from PCT/US2007/071543, dated Mar. 28, 2008.
Blanc, J., et al., "Properties of High-Resistivity Gallium Arsenide Compensated with Diffused Copper", Journal of Applied Physics, vol. 32, No. 9, pp. 1666-1679, 1961.
Buttram, M., "Chapter 1: Introduction", High-Power Optically Activated Solid-State Switches, eds. A. Rosen and F. Zutavem. Artech House, Norwood, Massachusetts, 1994, p. 2.
Cheng, L., et al., "Fast Switching (41 MHz), m omega-cm2, High Current 4H-SiC VJFETs for High Power and High Temperature Applications", Presented at Inter. Conf. Silicon Carbide and Related Mat. (ICSCRM), Pittsburgh, Pennsylvania, 2005.
Das, H., et al., "The Creation of Boron Deep Levels by High Temperature Annealing of 4H-SiC", Thesis, Master of Science in Electrical Engineering, Mississippi State University, pp. 45-46, 2004.
Hudgins, J., et al., "Chapter 3: Thyristors", Power Electronics Handbook, ed. M.H. Rashid, Academic Press, San Diego, CA, 2001, p. 44.
Jenny, J.R., et al., "Optical and Electrical Characterization of Boron Impurities in Silicon Carbide Grown by Physical Vapor Transport", J. Appl. Phys., vol. 79, pp. 2326-2331, 1996.
Krein, P., "Chapter 1: Introduction", Power Electronics Handbook, ed. M.H. Rashid, Academic Press, San Diego, CA, 2001, pp. 7-8.
Krein, P., "Chapter 1: Introduction", Power Electronics Handbook, ed. M. FL. Rashid, Academic Press, San Diego, CA, 2001, p. 10.
Mazzola, M.S., et al., "GaAs Photoconductive Closing Switches with High Dark Resistance and Microsecond Conductivity Decay", Appl. Phys. Lett., vol. 54, pp. 742-744, 1989.
Mazzola, M.S., et al., "Nanosecond Optical Quenching of Photoconductivity in a Bulk GaAs Switch", Appl. Phys. Lett., vol. 55, pp. 2102-2104, 1989.
Mazzola, M.S., et al., "Analysis of Nonohmic Current-Voltage Characteristics in a Cu-Compensated, Optically Activated GaAs Photoconductor", Applied Physics Letters, vol. 59, No. 10, pp. 1182-1184, 1991.
Mazzola, M.S., et al., "Infrared Quenching of Conductivity at High Electric Fields in a Bulk, Copper-Compensated, Optically Activated GaAs Switch", IEEE Trans. Electron Dev., vol. 37, No. 12, pp. 2499-2505, 1990.
Mazzola, M.S., et al., "Observation of the D-Center in 6H-SiC p-n Diodes Grown by Chemical Vapor Deposition", Appl. Phys. Lett., vol. 64, No. 20, pp. 2370-2372, 1994.
Pocha, M.D., et al., "Chapter 3: High-Speed Switching in Photoconductors", High-Power Optically Activated Solid-State Switches, eds. A. Rosen and F. Zutaver. Artech House, Norwood, Massachusetts, 1994, p. 48.
Roush, R.A., et al., "Compensation of Shallow Silicon Donors by Deep Copper Acceptors in Gallium Arsenide", Applied Physics Letters, vol. 62, No. 21, pp. 2670-2672, 1993.
Saddow, S.E., et al., "Hole Capture by D-Center Defects in 6H-Silicon Carbide", Journal of Applied Physics, vol. 77, No. 1, pp. 318-322, 1995.
Saura, J., et al., "Laser-Quenching of Photoconductivity and Recombination Processes in Sensitive Photoconductors", Journal of Applied Physics, vol. 36, No. 11, pp. 3660-3662, 1965.
Schoenbach, K.H., "Chapter 6: Optically Activated Opening of Copper-Doped Gallium Arsenide Switches", High-Power Optically Activated Solid-State Switches, eds. A. Rosen and F. Zutavem. Artech House, Norwood, Massachusetts, 1994, p. 95.
Stoudt. D.C. et al., "Investigation of a Laser-Controlled, Copper-Doped GaAs Closing and Opening Switch for Pulsed Power Applications", Proc. IEEE Pulsed Power Conf., pp. 41-44, 1991.
Suttrop, W., et al., "Boron-Related Deep Centers in 6H-SiC", Appl. Phys. A, vol. 51, pp. 231-237, 1990.
Wilson, J., et al., "Optoelectronics: An Introduction", Prentice-Hall International, London 1983, pp. 323-324.
Zutavem, F., et al., "Chapter 11: High-Voltage Lateral Switches from Silicon or Gallium Arsenide", High-Power Optically Activated Solid-State Switches, eds. A. Rosen and F. Zutavem. Artech House, Norwood, Massachusetts, 1994, pp. 247-251.
U.S. Appl. No. 11/764,593, filed Jun. 18, 2007.
Pending U.S. Appl. No. 12/881,771, filed Sep. 14, 2010.
Pending U.S. Appl. No. 11/764,606, filed Jun. 18, 2007.

* cited by examiner

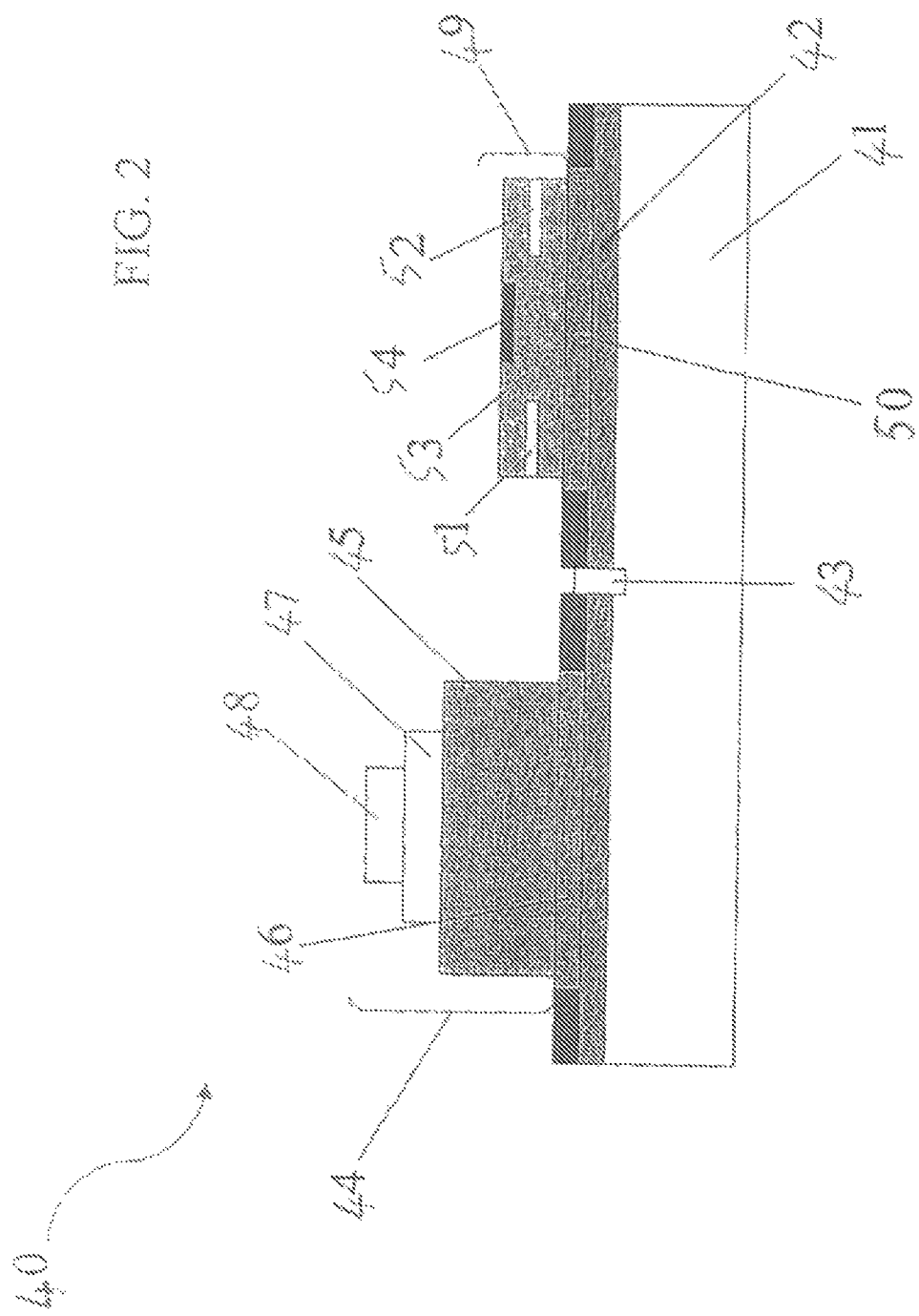

SILICON CARBIDE AND RELATED WIDE-BANDGAP TRANSISTORS ON SEMI INSULATING EPITAXY

This application is a continuation of U.S. patent application Ser. No. 12/881,771, filed on Sep. 14, 2010, which is a divisional of U.S. patent application Ser. No. 11/764,593, filed Jun. 18, 2007, now U.S. Pat. No. 7,821,015, which claims the benefit of Provisional U.S. Patent Application No. 60/805,139, filed on Jun. 19, 2006, expired. Each of the above applications is incorporated by reference herein in its entirety.

FIELD

The present invention relates generally to semiconductor devices and method of fabrication and more particularly to semiconductor devices employing a silicon carbide semi-insulating layer.

BRIEF SUMMARY

An aspect of the present invention is to provide a method of making a semi-insulating epitaxial layer. The method includes implanting a substrate or a first epitaxial layer formed on the substrate with boron ions to form a boron implanted region on a surface of the substrate or on a surface of the first epitaxial layer; and growing a second epitaxial layer on the boron implanted region of the substrate or on the boron implanted region of the first epitaxial layer to form a semi-insulating epitaxial layer.

Another aspect of the present invention is to provide a microelectronic device. The device includes a substrate, a semi-insulating silicon carbide epitaxial layer formed on the substrate. The semi-insulating silicon carbide epitaxial layer comprises boron and boron-related D-center defects. The microelectronic device also includes a first semiconductor device formed on the semi-insulating silicon carbide layer. The semi-insulated epitaxial silicon carbide layer is formed by implanting the substrate or a first epitaxial layer formed on the substrate with boron ions to form a boron implanted region on a surface of the substrate or on a surface of the first epitaxial layer, and growing a second epitaxial layer on the boron implanted region of the substrate or on the boron implanted region of the first epitaxial layer.

BRIEF DESCRIPTION OF THE DRAWINGS

FIG. 2 is a schematic representation of a cross-section of a first semiconductor device and a second semiconductor device formed on a same SiC chip, according to an embodiment of the present invention;

DETAILED DESCRIPTION OF SOME PREFERRED EMBODIMENTS

Figure 1:
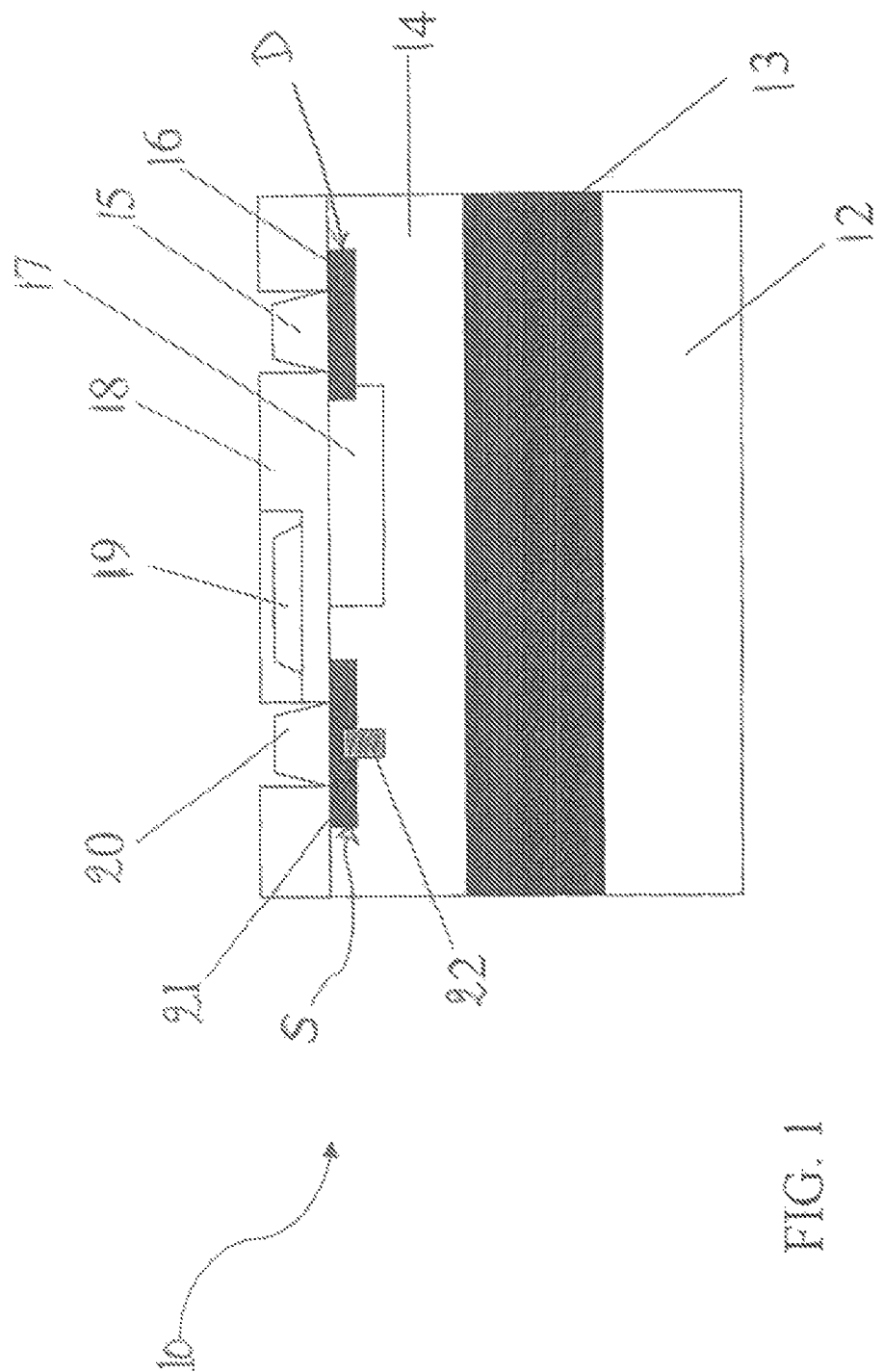
FIG. 1 is a schematic representation of a cross-section of a SiC MOSFET device, according to an embodiment of the present invention.

FIG. 1 is a schematic representation of a cross-section of a SiC MOSFET device, according to an embodiment of the invention. The device 10 includes a substrate 12 (e.g., n+ 6H silicon carbide), upon which is formed, such as by epitaxial growth, a semi-insulating silicon carbide epitaxial layer 13. A p− silicon carbide layer 14 is formed on the semi-insulating (SI) silicon carbide epitaxial layer 13. The p− silicon carbide layer 14 includes a graded implant region 17, such as an n-type drift region.

A source/body S, including, for example, a n+ source region, with contact area 20, a n+ source well 21, and a p+ body contact 22, as well as a drain D, including, for example, a n+ drain region, with contact area 15, and a n+ drain well 16, are formed on the p− silicon carbide layer 14. A silicon oxide layer 18 is also formed on the p− silicon carbide layer 14, along with a gate and contact area 19.

In one embodiment, all layers of the MOSFET device 10 are grown epitaxially. In one embodiment, the SI SiC layer 13 is created by one of a plurality of methods that will be described in detail in the following paragraphs.

FIG. 2 is a schematic representation of a cross-section of a first semiconductor device 44 and a second semiconductor device 49 formed on a same SiC chip 40, according to an embodiment of the invention. As shown in FIG. 2, SiC chip 40 includes a substrate 41, such as an n+ substrate, a SI layer 42, such as an epitaxial layer. An optional shallow trench isolation (STI) 43 is provided, as appropriate, for example, for device formation, to separate the first semiconductor device 44 and the second semiconductor device 49 (e.g., for electrical isolation).

In one embodiment, the first semiconductor device 44 is a vertical bipolar junction transistor (BJT) and the second semiconductor device 49 is a vertical junction field effect transistor (JFET). The BJT device 44 includes various features, such as a n− collector 45, a n+ subcollector 46, a p− base 47, and a n+ emitter 48. The vertical JFET 49 includes various features, such as a source layer 50. The source layer 50 can be, for example, a n+ layer. The vertical JFET 49 also includes gate regions 51 and 52 which can be p+ layers, and a drain region 53, which can be a n+ layer. A contact 54 is provided in the drain region 53.

Each of the devices 44 and 49 of FIG. 2 are intended to be merely illustrative of devices that may be formed on the SI layer 42. With SI epitaxy, these vertical power devices are capable of being integrated on the same chip as lateral power devices or lateral control circuitry, which forms the basis for a complex, multi-function (e.g., power conditioning, control, amplification) monolithic circuit in SiC, also known as a "Smart Power IC." A detailed description of various devices can be found in U.S. Pat. No. 7,009,209 to Casady et al. entitled "Silicon Carbide and Related Wide-Bandgap Transistors on Semi-Insulating Epitaxy for High Speed, High Power Applications," the contents of which are incorporated herein by reference.

First, electrical isolation between devices can be achieved. Technical performance and affordability are both enhanced by growing a semi-insulating epitaxial layer on a much higher quality and less expensive conducting 4H SiC substrate. Second, high power density integrated circuits can be better achieved using SiC rather than Silicon-on-Insulator (SOI) because the thermal conductivity of the semi-insulating SiC epitaxial layer is much higher than the thermal conductivity of SiO2 used in SOI. Therefore, waste heat can be removed far more efficiently. For example, based on the ratio of their thermal conductivities, a SI SiC buffer layer is able to thermally conduct up to 231 times as much heat on a per unit area basis as compared to the typical silicon-dioxide buffer layer used in SOI.

Various methods for growing SI SiC epitaxial films are described herein in the following paragraphs. A method includes using boron related D-center to compensate shallow nitrogen donors during growth of SiC epitaxial layers. The D-center, approximately 0.7 eV above the valence band in SiC, has been detected in all polytypes of SiC studied. The boron related D-center, also known as a "point defect," is related to the boron atom occupying a silicon substitution site in the SiC crystal.

The different polytypes of silicon carbide (e.g., 6H SiC and 4H SiC) can produce different characteristics in a semiconductor device, and thus can be used in various applications. One difference between 6H SiC and 4H SiC, for example, is the bandgap of these polytypes: the bandgap of 6H SiC is about 2.9 eV, while that of 4H SiC is about 3.2 eV. The 0.3 eV difference between these polytypes makes each typically suitable for different applications. For example, 4H SiC is often preferable for high voltage or high power applications, to take advantage of the larger bandgap, while 6H SiC is preferable, for example, for use in some applications because of its common commercial use in light emitting diodes. The present invention has been observed to work well in all SiC polytypes.

Many different solid sources of boron can be used to form the compensated epitaxial layer containing a boron-related D-center. In addition to the solid doping sources, the solid source of boron may also reside in the substrate, in another adjacent epitaxial layer, or in the epitaxial layer itself. In one embodiment, the transport of boron into the compensated epitaxial layer is by diffusion. Diffusion of the boron and the consequential formation of desirable D-center defects could occur during growth of the compensated epitaxial layer onto either the substrate or an adjacent conducting epitaxial layer first grown on the substrate.

A precondition for the diffusion is to implant boron into a surface of the substrate and/or the first conducting epitaxial layer. Damage in the crystalline structure of the implanted material facilitates anomalously fast diffusion of boron and a higher efficiency of D-center formation.

In one embodiment, a homogeneous method of implanting the boron directly into the targeted epitaxial layer itself may be utilized. In another embodiment, a heterogeneous method of solid source doping in an adjacent SiC material may be utilized. If the epitaxial layer is grown first, and boron is then implanted into that layer, boron will, in a subsequent thermal annealing step, redistribute and form D-centers. Either the heterogeneous or homogeneous embodiments will result in a device containing an epitaxially grown semi-insulating thin film of silicon carbide.

Figure 3A:
FIGS. 3A-3C depict the various steps for forming a semi-insulating epitaxial layer in which a substrate is utilized as a boron source, according to an embodiment of the present invention.
Figure 3B:
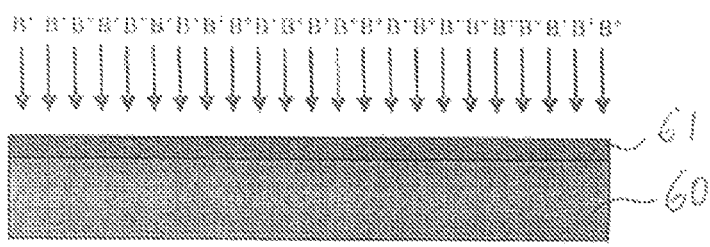
Figure 3C:

FIGS. 3A-3C depict the various steps for forming the semi-insulating (SI) epitaxial layer, according to an embodiment of the present invention. In this embodiment, the substrate may be utilized as a boron source. First, a substrate 60 is provided as depicted in FIG. 3A. The substrate 60 may comprise silicon carbide. The substrate can be, for example, a p-type SiC substrate. A surface of the substrate 60 is bombarded with boron ions to form a boron implanted region 61 in the substrate 60, as depicted in FIG. 3B. Following the formation of the boron implanted region 61, an epitaxial layer is grown on the boron implanted region 61. In one embodiment, the growth of the epitaxial layer is conducted at temperatures between about 1,500° C. and 1,700° C., for example, at a temperature of approximately 1,600° C. during a time period between about 1 hour to about 3 hours, for example during a time period of approximately 1 hour. In one embodiment, the epitaxial layer 62 is a n-type epitaxial layer. During the growth of the epitaxial layer 62, the boron in the boron region 61 diffuses into the epitaxial layer 62 to form the semi-insulating epitaxial layer 62, as shown in FIG. 3C. The boron implanted region 61 acts as a source of boron and the boron in the boron implanted region 61 diffuses into the epitaxial layer grown on the boron implanted region 61. The diffusion of boron into the epitaxial layer 62 forms the boron-related D-centers that compensate the shallow donors. While the material close to the surface of the grown epitaxial layer 62 is n-type, a profile closer to the interface with the boron-implanted substrate reveals a clear transition to p-type.

Figure 4A:
FIGS. 4A-4D depict the various steps for forming a semi-insulating epitaxial layer in which an epitaxial layer formed on a substrate is utilized as a boron source, according to another embodiment of the present invention.
Figure 4B:
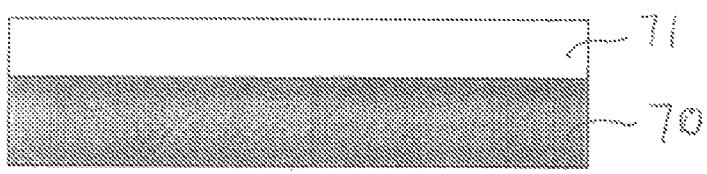
Figure 4C:
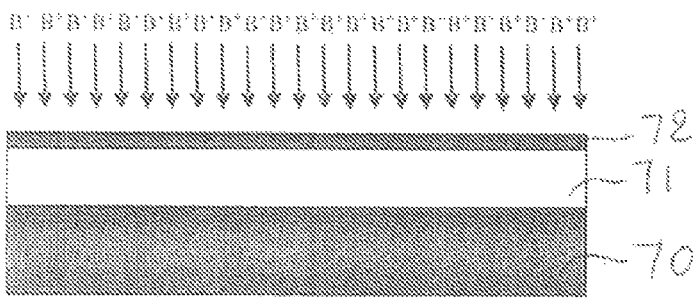
Figure 4D:
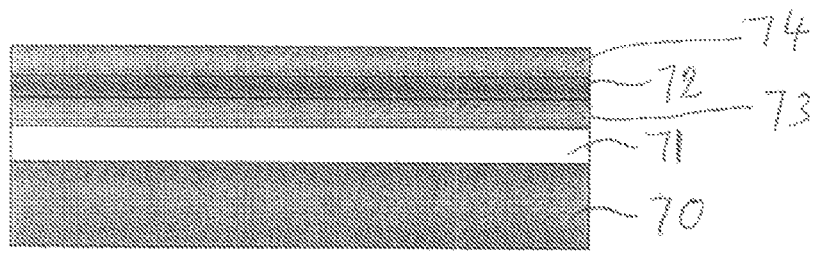

FIGS. 4A-4D depict the various steps for forming a semi-insulating (SI) epitaxial layer, according to another embodiment of the present invention. In this embodiment, an epitaxial layer is formed on a substrate, i.e., an epitaxial layer adjacent to the substrate, may be utilized as a boron source. A substrate 70 is provided as depicted in FIG. 4A. The substrate 70 may comprise silicon carbide. The substrate can be of any type, for example, a p-type SiC substrate. A first epitaxial layer 71 is formed on the substrate 70, as depicted in FIG. 4B. In one embodiment, the first epitaxial layer 71 is a n-type epitaxial layer. Following the formation of the first epitaxial layer 71, a surface of the first epitaxial layer 71 is bombarded with boron ions to form a boron implanted region 72 in the first epitaxial layer 71, as depicted in FIG. 4C. Following the formation of the boron implanted region 72, a second epitaxial layer 74 is grown on the boron implanted region 72. In one embodiment, the growth of the second epitaxial layer 74 is conducted at temperatures between about 1,500° C. and 1,700° C., for example, at a temperature of approximately 1,600° C. during a time period between about 1 hour to about 3 hours, for example during a time period of approximately 1 hour. In one embodiment, the second epitaxial layer 74 is a n-type epitaxial layer. During the growth of the second epitaxial layer 74, the boron in the boron region 72 diffuses into the first epitaxial layer 71 to form the semi-insulating layer 73 and diffuses into the second epitaxial layer 74 to form the semi-insulating epitaxial layer 74, as shown in FIG. 4D. The boron implanted region 72 acts as a source of boron and diffuses into the first and the second epitaxial layers. The diffusion of boron into the first and second epitaxial layers 71, 74 forms the boron-related D-centers in both the first epitaxial layer and the second epitaxial layer. The result is the formation of SI layers 73 and 74, respectively, below and above the boron implanted region 72.

Figure 5A:
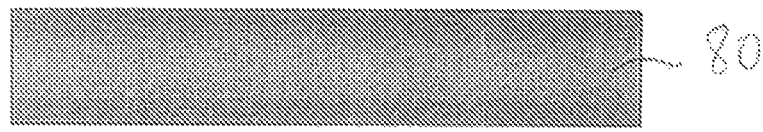
FIGS. 5A-5D depict the various steps for forming a semi-insulating epitaxial layer in which an epitaxial layer formed on a substrate is utlilized as a boron source, according to an alternative embodiment of the present invention.
Figure 5B:
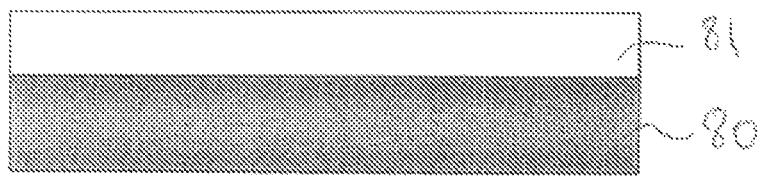
Figure 5C:
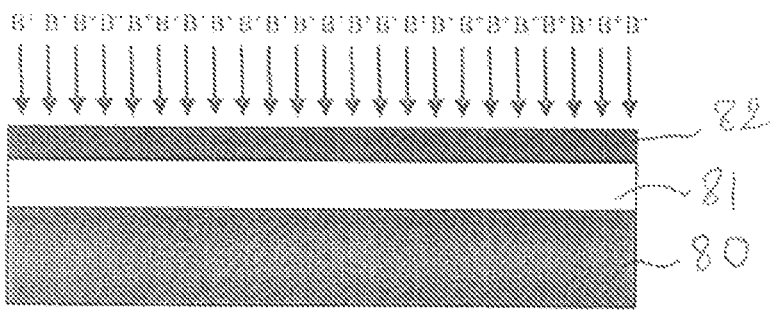
Figure 5D:

FIGS. 5A-5D depict the various steps for forming a semi-insulating (SI) epitaxial layer, according to further embodiment of the present invention. FIGS. 5A-5D illustrate an embodiment which is a homogenous alternative to the embodiments depicted in FIGS. 3A-3C and 4A-4D. In this embodiment, similar to the embodiment depicted in FIGS. 4A-4D an epitaxial layer formed on a substrate, i.e., an epitaxial layer adjacent to the substrate, may be utilized as a boron source. A substrate 80 is provided as depicted in FIG. 5A. The substrate 80 may comprise silicon carbide. The substrate can be of any type, for example, a p-type SiC substrate. An epitaxial layer 81 is formed on the substrate 80, as depicted in FIG. 5B. In one embodiment, the epitaxial layer 81 is a n-type epitaxial layer. Following the formation of the first epitaxial layer 81, a surface of the epitaxial layer 81 is bombarded with boron ions to form a boron implanted region 82 in the epitaxial layer 81, as depicted in FIG. 5C. In one embodiment, the growth of the epitaxial layer is conducted at temperatures between about 1,500° C. and 1,700° C., for example, at a temperature of approximately 1,600° C. during a time period between about 1 hour to about 3 hours, for example during a time period of approximately 1 hour. The boron in the boron region 82 diffuses into the epitaxial layer 81 to form the semi-insulating layer 83, as shown in FIG. 5D. The boron implanted region 82 acts as a source of boron and diffuses into the epitaxial layer 81 formed on the substrate 80. The diffusion of boron into the epitaxial layer forms the boron-related D-centers in the epitaxial layer 81 to obtain SI layer 83. Optionally, after forming the SI layer 83, the residual boron implanted region 82 can be removed using, for example, any etching technique known in the art. The obtained SI layer is specified to be p-type which is to say that it must be doped more heavily p-type than the underlying substrate.

Figure 6A:
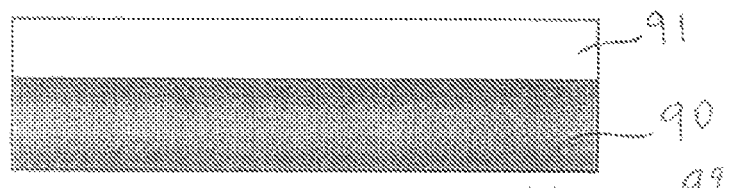
FIGS. 6A-6D depict the various steps for forming a semi-insulating (SI) epitaxial layer in which an epitaxial layer formed on a substrate is a utilized as a boron source and which a mask material is applied on a surface of epitaxial layer, according to another embodiment of the present invention.
Figure 6B:
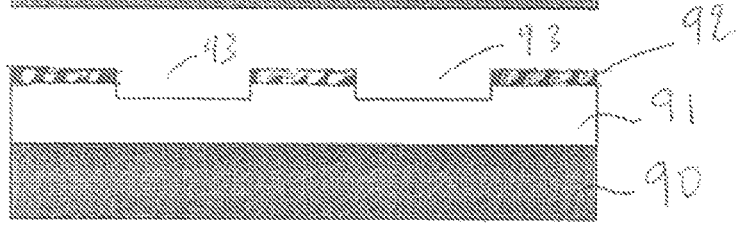
Figure 6C:
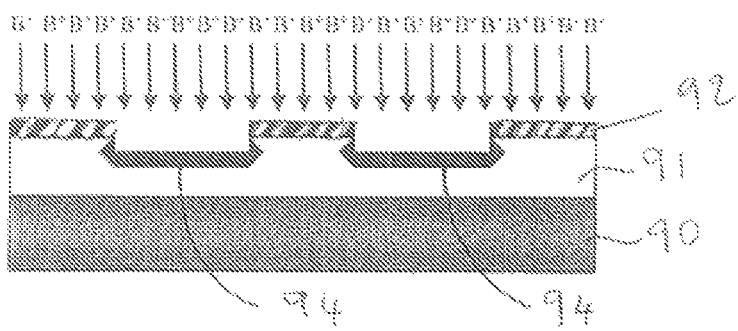
Figure 6D:
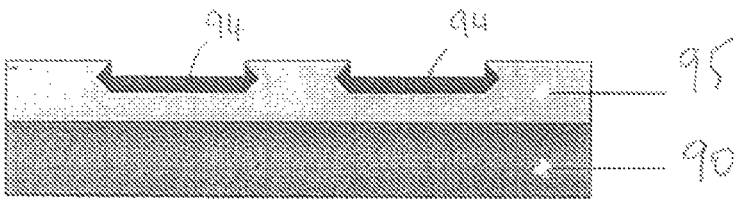

FIGS. 6A-6D depict the various steps for forming a semi-insulating (SI) epitaxial layer, according to another embodiment of the present invention. FIGS. 6A-6D illustrate an embodiment which is a variation of the method illustrated in FIGS. 5A-5D. In this embodiment, similar to the embodiment depicted in FIGS. 5A-5D an epitaxial layer formed on a substrate, i.e., an epitaxial layer adjacent to the substrate, may be utilized as a boron source. However, in this embodiment, a mask material is applied on a surface of the epitaxial layer. Specifically, a substrate 90 is provided as depicted in FIG. 6A. The substrate 90 may comprise silicon carbide. The substrate 90 can be of any type, for example, a n+-type SiC substrate. An epitaxial layer 91 is formed on the substrate 90, as depicted in FIG. 6A. In one embodiment, the epitaxial layer 91 is a n-type epitaxial layer. Following the formation of the first epitaxial layer 91, a mask material 92 is applied on a surface of the epitaxial layer 91 so as to form masked areas and unmasked areas on the surface of the epitaxial layer 91. After applying the mask material 92 on a surface of the epitaxial layer 91, trenches 93 are formed, for example by etching the unmasked (unprotected) areas of the epitaxial layer 91, as depicted in FIG. 6B. After forming the trenches 93, the surface of the epitaxial layer 91 on which the mask material 92 is deposited is bombarded with boron ions. In addition to being a mask for selective etching for forming trenches 93, the mask material 92 can also be selected to prevent implantation underneath masked areas of the epitaxial layer 91. In this way, the mask material 92 can also be used as "a dopant mask" to implant doping material in selective areas of the epitaxial layer. However, if the mask material 92 is not a dopant mask, the mask material 92 can be removed and another mask material suitable as a dopant mask can be applied on a surface of the epitaxial layer 91. The boron ions impinge unprotected areas of the epitaxial layer 91 including a bottom of the trench 93 and sidewall(s) of the trench 93. As a result, a boron implanted region 94 is formed in trench 93 of the epitaxial layer 91, as depicted in FIG. 6C. After forming the boron implanted region 94, the mask material 94 is removed, as shown in FIG. 6D, and a high temperature anneal process is applied resulting in the diffusion of boron deeper into the epitaxial layer 91. In one embodiment, the anneal process is performed at a temperature between about 1,500° C. and about 1,700° C. during a time period between about 1 hour and about 3 hours. In one example, the anneal process is performed at a temperature of about 1,600° C. during a time period of about 1 hour. The diffusion of boron into the epitaxial layer 91, in turn, results in the creation of D-centers to produce the semi-insulating epitaxial layer 95. The implantation of boron in the sidewall(s) of the trench 93, which is a phenomenon that is associated with implantation in trenches, assists in a lateral diffusion of boron into the channel formed by the trenches 93. Examples using the above method can be found in U.S. Pat. No. 6,767,783 to Casady et al., entitled "Self-Aligned Transistor and Diode Topologies in Silicon Carbide Through the Use of Selective Epitaxy or Selective implantation," the entire contents of which are incorporated herein by reference. The dimensions of the channel should be consistent with the expected diffusion length of boron and the range of creation of boron-related D-centers, which is of the order of a few micrometers.

A variation of the above method can use a lightly n-type epitaxial layer 91 that is thicker than an expected diffusion depth of boron which also determines the depth of D-center compensation and thus determines the thickness of the formed semi-insulating epitaxial layer 95. As a result, the remainder of the semiconductor between the substrate 90 and the semi-insulating epitaxial layer 95 is occupied by the residual n-type epitaxial layer 91.

Figure 7A:
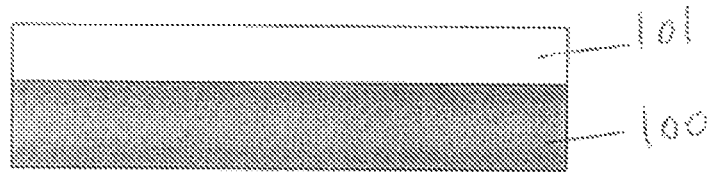
FIGS. 7A-7E depict the various steps for forming a semi-insulating (SI) epitaxial layer in which an epitaxial layer formed on a substrate is utilized as a boron source and a mask material is applied on a boron implanted region, according to yet another embodiment of the present invention.
Figure 7B:
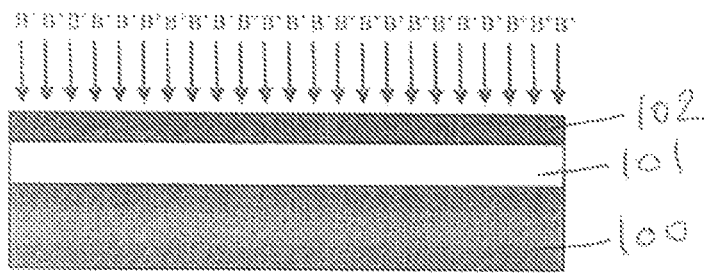
Figure 7C:
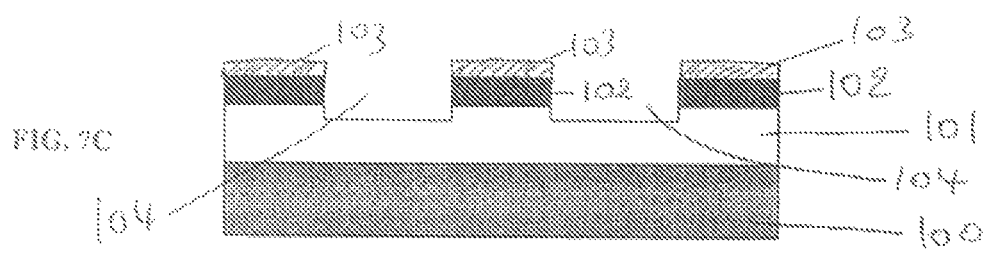

FIGS. 7A-7E depict the various steps for forming a semi-insulating (SI) epitaxial layer, according to another embodiment of the present invention. FIGS. 7A-7D illustrate an embodiment which is a variation of the method illustrated in FIGS. 4A-4D. In this embodiment, similar to the embodiment depicted in FIGS. 4A-4D an epitaxial layer formed on a substrate, i.e., an epitaxial layer adjacent to the substrate, may be utilized as a boron source. However, in this embodiment, a mask material is applied on a surface of a boron implanted region. Specifically, a substrate 100 is provided, as depicted in FIG. 7A. The substrate 100 may comprise silicon carbide. The substrate 100 can be of any type, for example, a n+-type SiC substrate. An epitaxial layer 101 is formed on the substrate 100, as depicted in FIG. 6A. In one embodiment, the epitaxial layer 101 is a n-type epitaxial layer. Following the formation of the epitaxial layer 101, a surface of the epitaxial layer 101 is bombarded with boron ions to form boron implanted region 102, as shown in FIG. 7B. A mask material 103 is applied on the boron implanted region 102 of the epitaxial layer 101 so as to define masked areas and unmasked areas on the surface of the epitaxial layer 101. After applying the mask material 103, trenches 104 are formed, for example by etching the unmasked (unprotected) areas of the epitaxial layer 101 and the unmasked areas of the boron implanted region 102, as depicted in FIG. 7C.

Figure 7D:
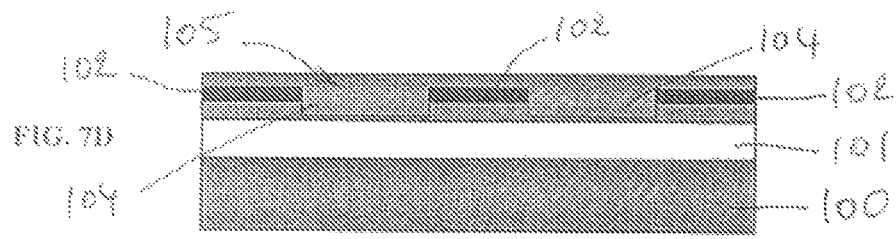
Figure 7E:
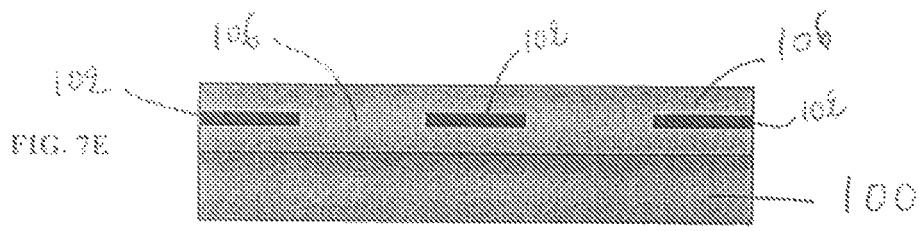

After forming the trenches 104, the mask material 103 is removed and another epitaxial layer 105 is grown on the epitaxial layer 101 and on the boron implanted region 102, as depicted in FIG. 7D. This is performed using a process that fills the trenches 104 and self-planarizes above the trenches 104. During the growth of the epitaxial layer 105, boron in boron implanted region 102 diffuses into both epitaxial layers 101 and 105 and create D-centers to produce a semi-insulating epitaxial layer 106, as depicted in FIG. 7E.

The above method can be used in the fabrication of various devices, examples of which can be found in U.S. patent application Ser. No. 11/198,298 of Lin Cheng and Michael S.

Mazzola, entitled "Vertical-Trench Junction Field-Effect Transistor Having Epitaxially Grown Drift, Buried Gate and Guard Rings, Self-Planarized Channel and Source Regions in Silicon Carbide," filed on Aug. 8, 2005, the entire contents of which are incorporated herein by reference. The dimensions of the channel should be consistent with the expected diffusion length of boron and the range of creation of boron-related D-centers, which is of the order of a few micrometers.

A variation of the above method uses a lightly n-type epitaxial layer 101 that is thicker than an expected diffusion depth of boron, which also determines the depth of D-center compensation and thus the thickness of the resulting semi-insulating epitaxial layer 106. As a result, the remainder of the semiconductor between the substrate 100 and the semi-insulating epitaxial layer 106 is occupied by the residual n-type epitaxial layer 101.

In one embodiment, in order to implant boron in the substrate or an adjacent epitaxial layer, the substrate or the adjacent epitaxial layer is bombared with boron ions having an energy between about 80 keV and 160 KeV. In one embodiment, a three-energy (80 keV, 115 keV, and 160 keV) boron implantation scheme with a total dose of $1.23 \times 10^{15}$ cm$^{-2}$ was applied to form a boron-rich near-surface layer.

Various embodiments of the present invention can be used for application in compact, solid-state television and radar transmitters operating from very high frequency (VHF) to above X-band (10 GHz). Various embodiments of the present invention can also be used for military applications, for example in airborne radar systems on in advanced military aircraft. Commercial applications include use of embodiments of the present invention in television transmitter stations, cellular telephone base stations, and satellite communication links for telephony, audio, and image transmission. Furthermore, efficient power switching utilizing compact direct current to direct current (DC-DC) converters and motor drive control circuitry can also take advantage of embodiments of the present invention in, for example, hybrid-electric vehicles and fluorescent lighting ballasts.

While various embodiments of the present invention have been described above, it should be understood that they have been presented by way of example, and not limitation. It will be apparent to persons skilled in the relevant art(s) that various changes in form and detail can be made therein without departing from the spirit and scope of the present invention. In fact, after reading the above description, it will be apparent to one skilled in the relevant art(s) how to implement the invention in alternative embodiments. Thus, the present invention should not be limited by any of the above-described exemplary embodiments.

Moreover, the method and apparatus of the present invention, like related apparatus and methods used in the semiconductor arts are complex in nature, are often best practiced by empirically determining the appropriate values of the operating parameters, or by conducting computer simulations to arrive at best design for a given application. Accordingly, all suitable modifications, combinations and equivalents should be considered as falling within the spirit and scope of the invention.

In addition, it should be understood that the figures, are presented for example purposes only. The method and devices of the present invention are sufficiently flexible and configurable, such that it may be utilized in ways other than that shown in the accompanying figures.

Further, the purpose of the Abstract of the Disclosure is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract of the Disclosure is not intended to be limiting as to the scope of the present invention in any way.

What is claimed is:

1. A semiconductor device comprising:
   a substrate;
   a lightly n-doped SiC epitaxial layer on the substrate, the SiC epitaxial layer having a lower surface in contact with the substrate;
   a semi-insulating region in the SiC epitaxial layer adjacent the lower surface of the SiC epitaxial layer, wherein the semi-insulating region comprises boron related D-centers that compensate for the light n-doping of the SiC epitaxial layer.

2. The semiconductor device of claim 1, further comprising a boron implanted region in the substrate adjacent the semi-insulating region.

3. The semiconductor device of claim 1, wherein the lightly n-doped SiC epitaxial layer is doped with shallow nitrogen donors.

4. The semiconductor device of claim 1, wherein the substrate comprises SiC.

5. The semiconductor device of claim 1, wherein the device is a vertical bipolar junction transistor or a vertical junction field effect transistor.

6. The semiconductor device of claim 1, wherein the boron related D-centers are distributed in the SiC epitaxial layer consistent with diffusion of boron from a source below the lower surface up into the SiC epitaxial layer.

7. The semiconductor device of claim 6, wherein the boron related D-centers are distributed in the SiC epitaxial layer consistent with diffusion at a temperature between about 1,500° C. and about 1,700° C. for a time period between about 1 hour and about 3 hours.

8. A semiconductor device comprising:
   a substrate;
   a first epitaxial layer on the substrate;
   a second lightly n-doped SiC epitaxial layer on the first epitaxial layer, the second epitaxial layer having a lower surface in contact with the first epitaxial layer;
   a semi-insulating region in the SiC epitaxial layer adjacent the lower surface of the SiC epitaxial layer, wherein the semi-insulating region comprises boron related D-centers that compensate for the light n-doping of the SiC epitaxial layer.

9. The semiconductor device of claim 8, further comprising a boron implanted region in the first epitaxial layer adjacent the semi-insulating region.

10. The semiconductor device of claim 8, wherein the lightly n-doped SiC epitaxial layer is doped with shallow nitrogen donors.

11. The semiconductor device of claim 8, wherein the first epitaxial layer comprises SiC.

12. The semiconductor device of claim 8, further comprising one or more trenches formed in the first epitaxial layer, the one or more trenches each comprising a lower surface and sidewalls, wherein an upper surface of the first epitaxial layer is adjacent the one or more trenches and wherein the second epitaxial layer fills the trenches and forms a self-planarized layer above the trenches.

13. The semiconductor device of claim 12, wherein the semi-insulating region is adjacent the lower surface of the one or more trenches.

14. The semiconductor device of claim 12, wherein the semi-insulating region is adjacent the upper surface of the first epitaxial layer.

15. The semiconductor device of claim 8, wherein the device is a vertical bipolar junction transistor or a vertical junction field effect transistor.

16. The semiconductor device of claim 8, wherein the boron related D-centers are distributed in the SiC epitaxial layer consistent with diffusion of boron from a source below the lower surface up into the SiC epitaxial layer.

17. The semiconductor device of claim 8, wherein the boron related D-centers are distributed in the SiC epitaxial layer consistent with diffusion at a temperature between about 1,500° C. and about 1,700° C. for a time period between about 1 hour and about 3 hours.

* * * * *